(12) United States Patent
Gauzner et al.

(10) Patent No.: US 6,949,199 B1
(45) Date of Patent: Sep. 27, 2005

(54) HEAT-TRANSFER-STAMP PROCESS FOR THERMAL IMPRINT LITHOGRAPHY

(75) Inventors: Gennady Gauzner, Livermore, CA (US); Koichi Wago, Sunnyvale, CA (US); David Shiao-Min Kuo, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 55 days.

(21) Appl. No.: 10/087,846

(22) Filed: Mar. 5, 2002

Related U.S. Application Data (60) Provisional application No. 60/312,928, filed on Aug. 16, 2001.

(51) Int. Cl.[7] .......................... B29C 59/00; B81C 1/00; B82B 3/00
(52) U.S. Cl. .................. 216/2; 216/9; 216/22; 216/41; 216/49; 216/52; 264/320; 977/DIG. 1
(58) Field of Search .......................... 216/2, 9, 52, 22, 216/41, 49; 264/320

(56) References Cited

U.S. PATENT DOCUMENTS

| | | | |
|---|---|---|---|
| 4,268,465 A * | 5/1981 | Suh et al. .................... 264/451 |
| 4,731,155 A | 3/1988 | Napoli et al. .................. 216/44 |
| 5,058,342 A * | 10/1991 | Crompton ..................... 52/232 |
| 5,475,040 A * | 12/1995 | Jamison et al. ............. 523/513 |
| 5,772,905 A * | 6/1998 | Chou ........................... 216/44 |
| 5,817,242 A | 10/1998 | Biebuyck et al. ............. 216/41 |
| 5,820,769 A * | 10/1998 | Chou ........................... 216/22 |
| 6,117,344 A | 9/2000 | Cox et al. ..................... 216/11 |
| 6,165,911 A | 12/2000 | Calveley ...................... 438/754 |
| 6,168,845 B1 | 1/2001 | Fontana, Jr. et al. ........ 428/65.5 |
| 6,190,929 B1 | 2/2001 | Wang et al. .................. 438/20 |
| 6,228,294 B1 | 5/2001 | Lee et al. ..................... 264/39 |
| 6,347,016 B1 * | 2/2002 | Ishida et al. .................. 360/17 |
| 2002/0025408 A1 * | 2/2002 | Davis .......................... 428/141 |
| 2003/0062145 A1 * | 4/2003 | Frasier et al. ............. 164/122.1 |

* cited by examiner

*Primary Examiner*—Anita Alanko
(74) *Attorney, Agent, or Firm*—McDermott Will & Emery LLP (57) ABSTRACT

A method of performing thermal imprint lithography of a surface of a thermoplastic layer-coated workpiece for forming a pattern therein comprises pre-heating the workpiece to a pre-selected high temperature prior to inserting the workpiece in a stamping/imprinting tool maintained at a predetermined lower temperature, whereby the interval for thermal cycling of the stamping/imprinting tool between higher and lower temperatures is eliminated or at least reduced. Applications of the method include forming servo patterns in disk-shaped substrates for hard disk recording media.

16 Claims, 4 Drawing Sheets

HEAT-TRANSFER-STAMP PROCESS FOR THERMAL IMPRINT LITHOGRAPHY

CROSS-REFERENCE TO PROVISIONAL APPLICATION

This application claims priority from U.S. provisional patent application Ser. No. 60/312,928 filed Aug. 16, 2001, the entire disclosure of which is incorporated herein by reference.

FIELD OF THE INVENTION

The present invention relates to methods and devices for forming sub-micron sized features and patterns in large area substrate surfaces by means of thermal imprint lithography. The invention has particular utility in the formation of servo patterns in the surfaces of substrates utilized in the manufacture of data/information storage and retrieval media, e.g., hard disk magnetic media.

BACKGROUND OF THE INVENTION

Optical-based lithographic techniques are widely employed in the fabrication of integrated circuits (ICs) and other devices requiring very fine-dimensioned patterns or features. However, the constantly increasing demands of micro-miniaturization for increased data storage and computation require fabrication of devices with ever smaller dimensions, which demands tax or even exceed the limits of conventional optical lithographic patterning processes utilizing visible light. As a consequence, intense research has been conducted on ultra-violet (UV), X-ray, electron beam (e-beam), and scanning probe (SP) lithography. However, while each of these techniques is capable of providing high resolution, finely-dimensioned patterns and features, the economics of their use is less favorable, due to such factors as limitations arising from wavelength-dependent phenomena, slow e-beam and SP writing speeds, and difficulties in the development of suitable resist materials.

Thermal imprint lithography has been recently studied and developed as a low cost alternative technique for fine dimension pattern/feature formation in the surface of a substrate or workpiece, as for example, described in U.S. Pat. Nos. 4,731,155; 5,772,905; 5,817,242; 6,117,344; 6,165,911; 6,168,845 B1; 6,190,929 B1; and 6,228,294 B1, the disclosures of which are incorporated herein by reference. A typical thermal imprint lithographic process for forming nano-dimensioned patterns/features in a substrate surface is illustrated with reference to the schematic, cross-sectional views of FIGS. 1(A)–1(D).

Figure 1A:
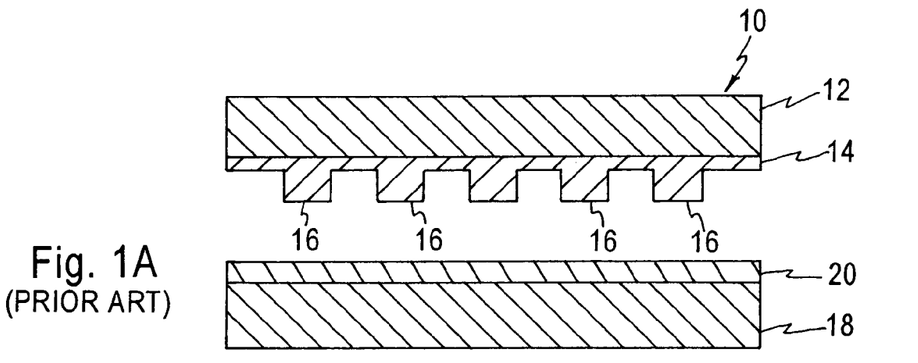
FIGS. 1(A)–1(D) are schematic, simplified cross-sectional views illustrating a process sequence for performing thermal imprint lithography of a thin resist film on a substrate (workpiece) according to the conventional art.

Referring to FIG. 1(A), shown therein is a mold 10 (also termed a "stamper/imprinter") including a main body 12 having upper and lower opposed surfaces, with a molding (i.e., stamping/imprinting) layer 14 formed on the lower opposed surface. As illustrated, molding layer 14 includes a plurality of features 16 having a desired shape or surface contour. A workpiece comprised of a substrate 18 carrying a thin film layer 20 on an upper surface thereof is positioned below, and in facing relation to the molding layer 14. Thin film layer 20 is typically comprised of a thermoplastic material, e.g., polymethyl methacrylate (PMMA), and may be formed on the substrate/workpiece surface by any appropriate technique, e.g., spin coating.

Figure 1B:
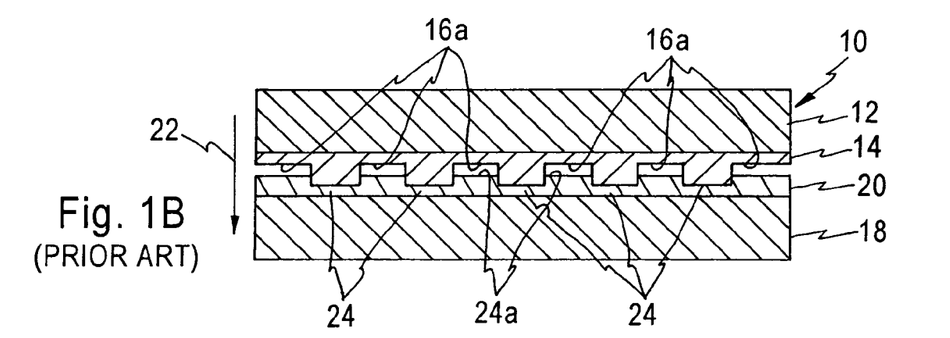

Adverting to FIG. 1(B), shown therein is a compressive molding step, wherein mold 10 is pressed into the thin film layer 20 in the direction shown by arrow 22, so as to form depressed, i.e., compressed, regions 24. In the illustrated embodiment, features 16 of the molding layer 14 are not pressed all of the way into the thin film layer 20 and thus do not contact the surface of the underlying substrate 18. However, the top surface portions 24a of thin film 20 may contact depressed surface portions 16a of molding layer 14. As a consequence, the top surface portions 24a substantially conform to the shape of the depressed surface portions 16a, for example, flat. When contact between the depressed surface portions 16a of molding layer 14 and thin film layer 20 occurs, further movement of the molding layer 14 into the thin film layer 20 stops, due to the sudden increase in contact area, leading to a decrease in compressive pressure when the compressive force is constant.

Figure 1C:
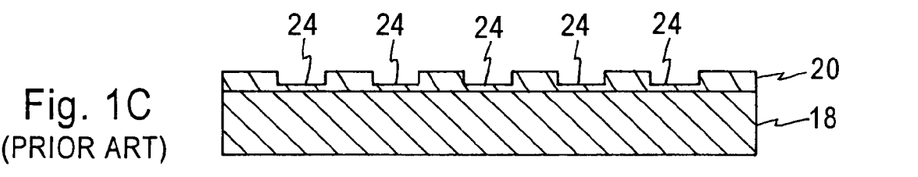
Figure 1D:
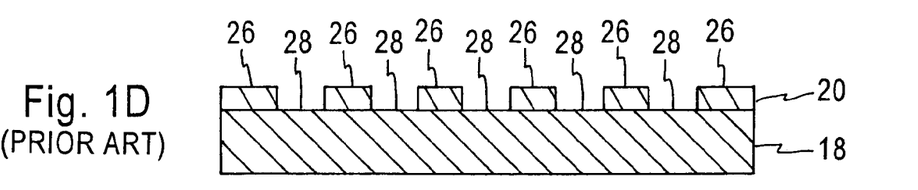

FIG. 1(C) shows the cross-sectional surface contour of the thin film layer 20 following removal of mold 10. The molded, or imprinted, thin film layer 20 includes a plurality of recesses formed at compressed regions 24 which generally conform to the shape or surface contour of features 16 of the molding layer 14. Referring to FIG. 1(D), in a next step, the surface-molded workpiece is subjected to processing to remove the compressed portions 24 of thin film 20 to selectively expose portions 28 of the underlying substrate 18 separated by raised features 26. Selective removal of the compressed portions 24, as well as subsequent selective removal of part of the thickness of substrate 18 at the exposed portions 28 thereof, may be accomplished by any appropriate process, e.g., reactive ion etching (RIE) or wet chemical etching.

The above-described imprint lithographic processing is capable of providing submicron-dimensioned features, as by utilizing a mold 10 provided with patterned features 16 comprising pillars, holes, trenches, etc., by means of e-beam lithography, RIE, or other appropriate patterning method. Typical depths of features 16 range from about 5 to about 500 nm, depending upon the desired lateral dimension. The material of the molding layer 14 is typically selected to be hard relative to the thin film layer 20, the latter typically comprising a thermoplastic material which is softened when heated. Thus, suitable materials for use as the molding layer 14 include metals, dielectrics, semiconductors, ceramics, and composite materials. Suitable materials for use as thin film layer 20 include thermoplastic polymers which can be heated to above their glass temperature, $T_g$, such that the material exhibits low viscosity and enhanced flow.

Figure 2:
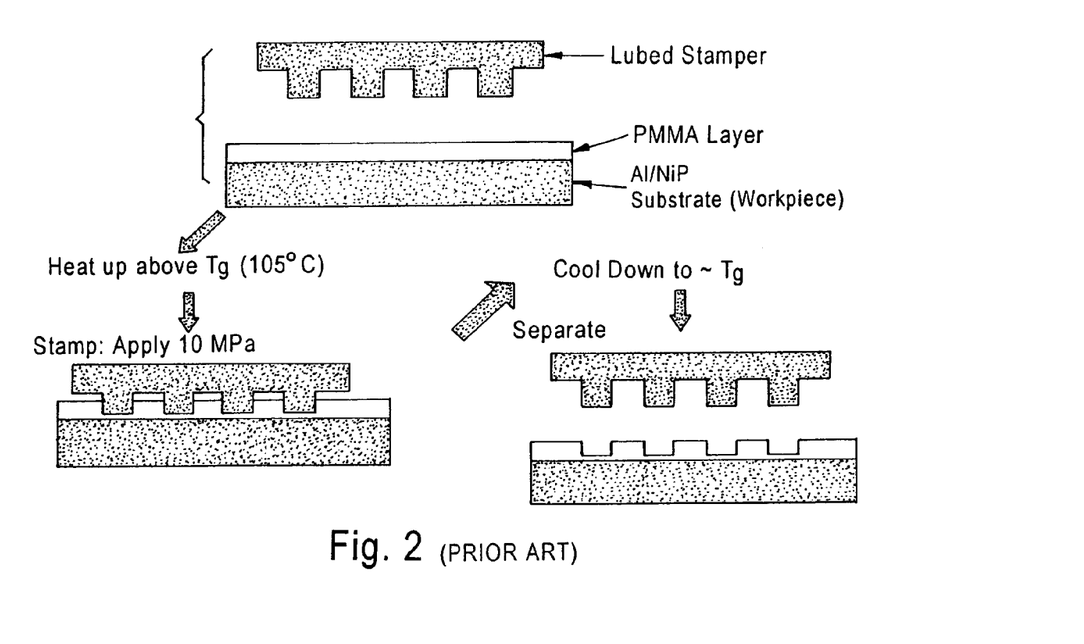
FIG. 2 schematically illustrates, in simplified cross-sectional view, another sequence of steps for performing imprint lithography of a resist film according to the conventional art.

Referring now to FIG. 2, schematically illustrated therein, in simplified cross-sectional view, is a typical sequence of processing steps for performing nano-imprint lithography of a metal-based substrate/workpiece, i.e., an Al/NiP substrate/workpiece, utilizing a conventional "master" or stamper/imprinter, e.g., a Ni-based stamper/imprinter. In a preliminary step, a thin film of a thermoplastic polymer, i.e., polymethyl methacrylate (PMMA) is spin-coated on an annular disk-shaped Al/NiP substrate/workpiece, corresponding to substrates conventionally employed in the manufacture of hard disk magnetic recording media. In another preliminary step, a Ni stamper/imprinter having an imprinting surface with a negative image pattern of features, e.g., a servo pattern with lateral dimensions of about 600 nm and heights of about 170 nm, is fabricated by conventional optical lithographic patterning/etching techniques, provided with a thin layer of an anti-sticking or release agent (typically a fluorinated polyether compound such as Zdol™, available from Ausimont, Thorofare, N.J.), and installed in a stamping/imprinting tool. In the next step according to the conventional methodology for performing thermal imprint lithography, the substrate/workpiece is placed in the stamping/imprinting tool and heated along with the stamper/imprinter to a temperature above the glass transition temperature ($T_g$) of the PMMA, i.e., above about 105° C., e.g., about 120° C., after which the patterned imprinting surface of the Ni-based stamper/imprinter is pressed into contact with the surface of the heated thermoplastic PMMA layer on the substrate/workpiece at a suitable pressure, e.g., about 10 MPa. As a consequence, the negative image of the desired pattern on the imprinting surface of the Ni-based stamper/imprinter embossed into the surface of the thermoplastic PMMA layer. The stamper/imprinter is then maintained within the stamping/imprinting tool in contact with the PMMA layer and under pressure for an interval until the system cools down to an appropriate temperature, e.g., about 70° C., after which interval the substrate/workpiece is removed from the stamping/imprinting tool and the stamper/imprinter separated from the substrate/workpiece to leave replicated features of the imprinting surface in the surface of the PMMA layer.

A significant drawback associated with the above-described thermal imprint lithography process is the extremely long interval, e.g., 15–25 min., required for thermal cycling of the relatively massive stamping/imprinting tool utilized for imprinting each workpiece or group of workpieces (e.g., typically involving heating of the tool to about 200° C. for imprinting of the substrate/workpiece, followed by cooling to about 70° C. for removal of the imprinted substrate/workpiece from the tool). Such long thermal cycling intervals are incompatible with the product throughput requirements for large-scale, economically competitive, automated manufacturing processing of e.g., hard disk magnetic recording media.

In view of the above, there exists a need for improved methodology for performing thermal imprint lithography which eliminates, or at least substantially reduces, the disadvantageously long interval required for thermal cycling of the stamping/imprinting tool associated with conventional thermal imprint lithography. More specifically, there exists a need for improved methodology for rapidly and cost-effectively imprinting or embossing a pattern, e.g., a servo pattern, in a surface of a resist or other type relatively soft layer on the surface of a substrate for a data/information storage and retrieval medium, e.g., a hard disk magnetic recording medium.

The present invention addresses and solves drawbacks associated with long thermal cycling intervals associated with conventional techniques and methodologies for performing thermal imprint lithography for pattern definition in substrate/workpiece surfaces, such as in the fabrication of hard disk substrates with integrally formed servo patterns, while maintaining full compatibility with all aspects of conventional automated manufacturing technology for pattern formation by imprint lithography. Further, the methodology and means afforded by the present invention enjoy diverse utility in the imprint lithographic patterning of a variety of substrates and workpieces.

DISCLOSURE OF THE INVENTION

An advantage of the present invention is an improved method of performing thermal imprint lithography of a workpiece surface, whereby the disadvantageously long interval for thermal cycling of the stamping/imprinting tool is eliminated, or at least substantially reduced.

Another advantage of the present invention is an improved method of performing thermal imprint lithography for patterning of substrates utilized in the manufacture of hard disk recording media.

Still another advantage of the present invention is an improved method of performing thermal imprint lithography for forming servo patterns in substrates utilized in the manufacture of hard disk recording media.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a method of performing thermal imprint lithography of a surface of a workpiece for forming a pattern therein, comprising pre-heating the workpiece to a pre-selected elevated temperature prior to inserting the workpiece in a stamping/imprinting tool for performing the thermal imprint lithography, whereby the interval for thermal cycling of the stamping/imprinting tool between higher and lower temperatures is eliminated or at least reduced.

According to embodiments of the present invention, the temperature of the stamping/imprinting tool is maintained substantially constant at a pre-selected temperature lower than the pre-selected elevated temperature of the pre-heated workpiece.

In accordance with certain embodiments of the present invention, the method comprises the steps of:
(a) providing a stamping/imprinting tool including a stamper/imprinter having an imprinting surface comprising a negative image of the pattern to be formed in the workpiece surface;
(b) maintaining the stamper/imprinter of the stamping/imprinting tool at a pre-selected first high temperature;
(c) providing a workpiece having first, upper and second, lower surfaces;
(d) heating the workpiece to a pre-selected second high temperature greater than the pre-selected first high temperature;
(e) transferring the heated workpiece to the stamping/imprinting tool;
(f) urging the first, upper surface of the heated workpiece against the imprinting surface of the heated stamper/imprinter at a pre-selected high pressure sufficient to imprint the pattern in the first, upper surface;
(g) continuing urging the first, upper surface of the heated workpiece against the imprinting surface of the heated stamper/imprinter at the pre-selected high pressure for a pre-selected interval, during which interval the temperature of the heated workpiece is lowered to the pre-selected first high temperature of the stamper/imprinter;
(h) separating the imprinted surface of the workpiece from the imprinting surface of the stamper/imprinter; and
(i) removing the workpiece from the stamping/imprinting tool.

According to particular embodiments of the present invention, step (c) comprises providing a workpiece in the form of a flat, disk-shaped substrate for a hard disk recording medium, the first, upper surface of the substrate being coated with a layer of a thermoplastic material, the substrate comprises Al, an Al-based alloy, NiP-coated Al, glass, ceramic, or a glass-ceramic composite material; step (a) comprises providing a stamping/imprinting tool including a stamper/imprinter having an imprinting surface comprising a negative image of a servo pattern to be formed in the first, upper surface of the workpiece, the stamper/imprinter having a Ni imprinting surface, the latter being coated with a layer of a release agent, e.g., a layer of a fluorinated polyether compound; step (b) comprises maintaining the stamper/imprinter at a pre-selected first high temperature close to a glass transition temperature $T_g$ of the layer of thermoplastic material on the first, upper surface of the substrate; step (d) comprises heating the workpiece to the pre-selected second high temperature which is greater than the pre-selected first high temperature of the stamper/imprinter and greater than the glass transition temperature $T_g$ of the layer of thermoplastic material on the first, upper surface of the substrate; and step (f) comprises commencing urging of the heated substrate against the imprinting surface of the heated stamper/imprinter when the temperature of the heated substrate is above the glass transition temperature $T_g$ of the layer of thermoplastic material on the first, upper surface of the substrate.

According to embodiments of the present invention, step (c) comprises providing a substrate including a first, upper surface coated with a layer of a polymethyl methacrylate (PMMA) thermoplastic material having a glass transition temperature of about 105° C.; step (b) comprises maintaining the stamper/imprinter at a pre-selected first high temperature of about 120° C.; and step (d) comprises heating the workpiece to a pre-selected second high temperature of about 200° C.

In accordance with further embodiments of the present invention, step (a) comprises providing a stamping/imprinting tool including first, upper and second, lower mounting means for respectively mounting thereon the stamper/imprinter and the workpiece, each of the first and second mounting means including heating means for maintaining the respective mounting means at the pre-selected first temperature; and step (e) comprises placing the second, upper surface of the heated workpiece in overlying relation to the second, lower mounting means.

According to still further embodiments of the present invention, step (c) comprises providing a workpiece having a thermally insulating spacer, e.g., of glass, in contact with the second, lower surface thereof, whereby the rate of temperature reduction of the heated workpiece from the pre-selected second, higher temperature established in step (d) is lowered relative to the rate of temperature reduction obtained in the absence of the thermally insulating spacer.

Another aspect of the present invention is a method of forming a desired pattern in a surface of a substrate for a hard disk recording medium, comprising the steps of:

(a) providing a substrate in the form of a flat disk having first, upper and second, lower surfaces, the first, upper surface being coated with a layer of a thermoplastic material;

(b) providing a stamping/imprinting tool including a stamper/imprinter having an imprinting surface comprising a negative image of the pattern to be formed in the surface of the substrate;

(c) maintaining the stamper/imprinter of the stamping/imprinting tool at a pre-selected first high temperature close to a glass transition temperature $T_g$ of the layer of thermoplastic material on the first, upper surface of the substrate;

(d) heating the substrate to a pre-selected second high temperature which is greater than the pre-selected first high temperature of the stamper/imprinter and greater than the glass transition temperature $T_g$ of the layer of thermoplastic material on the first, upper surface of the substrate;

(e) transferring the heated substrate to the stamping/imprinting tool;

(f) urging the heated substrate against the imprinting surface of the heated stamper/imprinter at a pre-selected high pressure sufficient to imprint the pattern in the layer of thermoplastic material on the first, upper surface of the substrate, wherein the temperature of the substrate when the urging of the heated substrate against the imprinting surface of the heated stamper/imprinter commences is above the glass transition temperature $T_g$ of the layer of thermoplastic material on the first, upper surface of the substrate;

(g) continuing urging the heated substrate against the imprinting surface of the heated stamper/imprinter at the pre-selected high pressure for a pre-selected interval, during which interval the temperature of the heated substrate is lowered to the pre-selected first high temperature of the stamper/imprinter;

(h) separating the substrate with the imprinted layer of thermoplastic material thereon from the imprinting surface of the stamper/imprinter; and (i) removing the substrate from the stamping/imprinting tool.

According to certain embodiments of the present invention, step (b) comprises providing the stamping/imprinting tool as including first, upper and second, lower mounting means for respectively mounting thereon the stamper/imprinter and the substrate, each of the first and second mounting means including heating means for maintaining the respective mounting means at the pre-selected first temperature; and step (e) comprises placing the second, upper surface of the heated substrate in overlying relation to the second, lower mounting means.

In accordance with further embodiments of the present invention, step (a) comprises providing a substrate having a thermally insulating spacer in contact with the second, lower surface thereof, whereby the rate of temperature reduction of the heated substrate from the pre-selected second, higher temperature established in step (d) is lowered relative to the rate of temperature reduction obtained in the absence of the thermally insulating spacer.

According to particular embodiments of the present invention, step (a) comprises providing a substrate comprising Al, an Al-based alloy, NiP-coated Al, glass, ceramic, or a glass-ceramic composite material, the substrate comprising a first, upper surface coated with a layer of a polymethyl methacrylate (PMMA) thermoplastic material having a glass transition temperature of about 105° C.; step (b) comprises providing a stamping/imprinting tool comprising a stamper/imprinter having an imprinting surface including a negative image of a servo pattern to be formed in the thermoplastic PMMA layer on the first, upper surface of the substrate; step (c) comprises maintaining the stamper/imprinter at a pre-selected first high temperature of about 120° C.; and step (d) comprises heating the workpiece to a pre-selected second high temperature of about 200° C.; wherein step (b) further comprises providing a stamper/imprinter having a Ni imprinting surface, the Ni imprinting surface including thereon a layer of a release agent.

In accordance with embodiments of the present invention, the method comprises the further steps of:

(j) forming the desired pattern in the first, upper surface of the substrate by a process comprising selective removal of substrate material, utilizing the imprinted layer of thermoplastic material as a pattern-defining mask; and (k) selectively removing the imprinted layer of thermoplastic material subsequent to performing step (j).

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the features are not necessarily drawn to scale but rather are drawn as to best illustrate the pertinent features, wherein.

DESCRIPTION OF THE INVENTION

The present invention addresses and solves problems attendant upon the use of thermal imprint lithography, e.g., nano-imprint lithography for forming submicron-dimensioned patterns in a workpiece surface, as in servo patterning of disk-shaped substrates utilized in the manufacture of hard disk recording media. Specifically, the present invention provides a substantial and significant improvement in product throughput, energy consumption, and cost-effectiveness of thermal imprint lithography when performed as part of a continuous, automated manufacturing process, e.g., hard disk manufacture, and is based upon the discovery that the long thermal cycling intervals associated with conventional thermal imprint techniques can be eliminated, or at least substantially reduced, while maintaining full compatibility with all other aspects of conventional automated manufacturing technology for pattern formation by thermal imprint lithography for disk media fabrication.

According to a key feature of the present invention, the workpiece, i.e., substrate, including a layer of an imprintable thermoplastic material formed on a surface thereof, is pre-heated (in a separate heating means) to a pre-selected high temperature prior to insertion of the heated workpiece in the stamping/imprinting tool employed for performing the thermal imprint lithography, whereby the usual interval for thermal cycling of the stamping/imprinting tool between higher and lower temperatures is eliminated or at least reduced. According to another key feature of the present invention, the "process window", i.e., the maximum allowable interval between removal of the pre-heated workpiece from the separate heating means and its insertion in the stamping/imprinting tool, is increased by placement of a thermally insulating spacer layer beneath the lower surface of the workpiece, whereby the rate of heat loss therefrom, hence rate of temperature reduction, is reduced.

Figure 3:
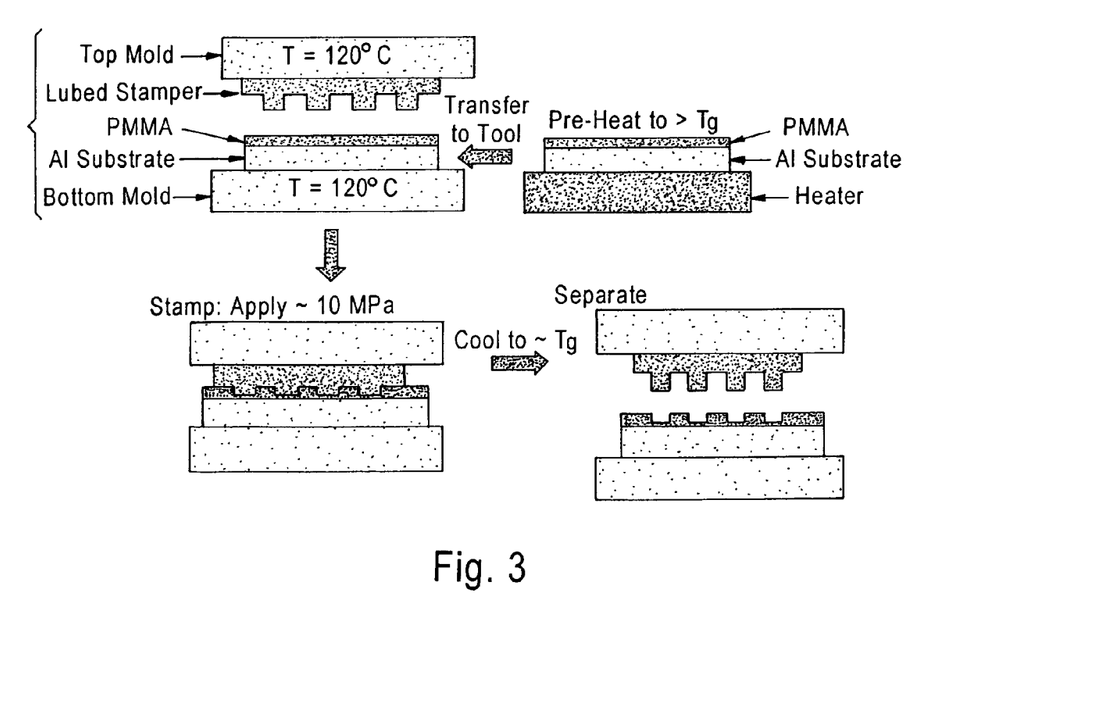
FIG. 3 schematically illustrates, in simplified cross-sectional view, a sequence of steps for performing imprint lithography of a resist film according to an embodiment of the present invention.

FIG. 3 schematically shows, in simplified cross-sectional view, a sequence of steps for performing an illustrative, but not limitative, embodiment of a high quality, high reproduction fidelity "HTS" (Heat-Transfer-Stamp) process for performing nano-imprint lithography of a metal-based substrate/workpiece, i.e., an Al, Al alloy, or Al/NiP substrate workpiece, utilizing a conventional Ni-surfaced "master" or stamper/imprinter, which process includes the advantageous substrate/workpiece pre-heating step of the invention. Specifically, in a preliminary step, a thin film or layer of a thermoplastic polymer, e.g., polymethyl methacrylate (PMMA), is spin-coated on an annular disk-shaped Al/NiP substrate/workpiece, corresponding to substrates conventionally employed in the manufacture of hard disk magnetic recording media. In another preliminary step, a stamper/imprinter having a Ni or Ni alloy imprinting surface formed with a negative image pattern of features, e.g., a servo pattern with lateral dimensions of about 600 nm and heights of about 170 nm, is fabricated by conventional optical lithographic patterning/etching techniques, provided with a thin layer of an anti-sticking or release agent (typically a fluorinated polyether compound such as Zdol™, available from Ausimont, Thorofare, N.J.), and installed in a stamping/imprinting tool, by means of an upper mounting block in contact with the flat upper surface of the stamper/imprinter. The upper mounting block, termed a "top mold" in the figure, includes a heating means for maintaining the stamper/imprinter at an elevated temperature close to the glass transition temperature $T_g$ of the thermoplastic polymer layer, e.g., ~105° C. for PMMA. In the next step according to the invention, the substrate/workpiece is heated, as by placing the lower surface thereof in contact with a heater block separate from the stamping/imprinting tool, to an elevated temperature substantially greater than the glass transition temperature ($T_g$) of the PMMA thermoplastic layer, e.g., above about 105° C., typically about 200° C., after which the heated substrate/workpiece is rapidly transferred to the stamping/imprinting tool such that its lower surface is supported by a heated bottom mold (maintained at the same temperature ~$T_g$ as the heated top mold) and the patterned imprinting surface of the Ni-based stamper/imprinter pressed into contact with the surface of the heated thermoplastic PMMA layer of the substrate/workpiece at a suitable pressure, e.g., about 10 MPa. The short interval required for transfer of the heated substrate/workpiece to the stamping/imprinting tool for imprinting of the PMMA layer prior to lowering of the temperature of the PMMA layer below a minimum temperature required for imprinting, is termed the "process window". According to the invention, the transfer step is performed consistent with the short interval requirement of the process window, i.e., substrate/workpiece transfer is performed as rapidly as is practicable. Typically, transfer of the heated substrate/workpiece to the stamping/imprinting tool is accomplished within several seconds in order to prevent cooling of the heated PMMA thermoplastic layer to a temperature below that which provides optimal, high quality, faithful replication of the surface features of the imprinting surface of the stamper/imprinter. As a consequence of the high pressure urging of the patterned imprinting surface of the stamper/imprinter against the heated PMMA thermoplastic layer, the surface of the heated thermoplastic PMMA layer is imprinted (i.e., embossed) with the negative image of the desired pattern on the imprinting surface of the Ni-based stamper/imprinter. The stamper/imprinter is then maintained within the stamping/imprinting tool in contact with the PMMA layer and under pressure for an interval until the temperature of the substrate/workpiece with the imprinted PMMA layer thereon is lowered to the fixed temperature of the top and bottom molds, e.g., about 120° C., after which interval the substrate/workpiece is separated from the substrate/workpiece to leave replicated features of the imprinting surface in the surface of the PMMA layer and removed from the stamping/imprinting tool.

Thus, by performing the thermal imprinting process according to a sequence of steps wherein the temperature within the stamping/imprinting tool is maintained substantially constant via external pre-heating of the substrate/workpiece to a high temperature above the glass transition temperature of the thermoplastic layer, the present invention eliminates, or at least very substantially and significantly reduces the lengthy thermal cycling interval for heating and cooling of the stamping imprinting tool. The inventive methodology therefore affords several advantages vis-à-vis the conventional art, including, inter alia, reduced thermal cycling intervals; reduced imprint cycle times, e.g., on the order of from about 5 to about 100 sec., leading to greater product throughput rates; and reduced energy consumption resulting from the elimination or minimization of thermal cycling of the relatively massive stamping/imprinting tool.

Figure 4:
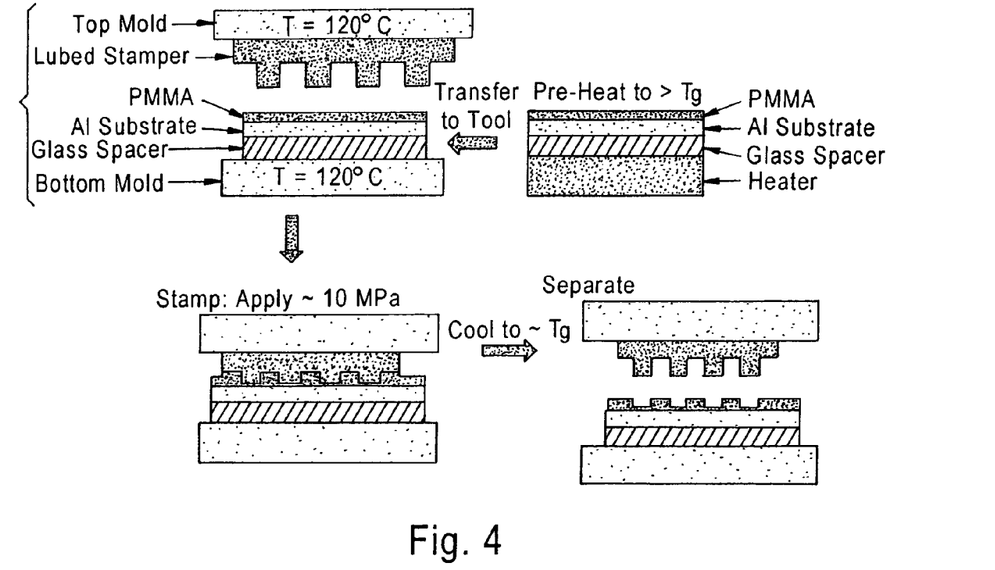
FIG. 4 schematically illustrates, in simplified cross-sectional view, a sequence of steps for performing imprint lithography of a resist film according to another embodiment of the present invention.

Adverting to FIG. 4, schematically shown therein, in simplified cross-sectional view, is a generally similar sequence of steps for performing an alternative embodiment of a high quality, high reproduction fidelity "HTS" (Heat-Transfer-Stamp) process for performing nano-imprint lithography of a metal-based substrate/workpiece, e.g., a disk-shaped Al, Al alloy, or Al/NiP substrate for a recording medium, for forming a servo pattern therein. The process of FIG. 4 differs in key respect from that illustrated in FIG. 3 in the placement of a thermally insulating spacer layer (typically a glass layer) intermediate the lower surface of the substrate and the upper, supporting surface of the heater during the substrate pre-heating step and intermediate the lower surface of the substrate and the upper, supporting surface of the bottom mold during the stamping/imprinting step. As is evident from the graphs of FIG. 5, placement of the thermally insulating spacer layer beneath the lower surface of the substrate moderates, i.e., reduces, the rate of heat loss from the substrate/workpiece after removal of the latter from contact with the heater utilized for the pre-heating step and during the interval prior to imprinting of the thermoplastic layer. As a consequence of the lower heat loss rate provided by the spacer layer, the "process window" for transfer of the heated substrate from the pre-heating block to the bottom mold of the stamper/imprinter before $T_{min.}$ is reached is substantially increased, e.g., from about 9 sec. with no glass spacer layer to about 24 sec. with a glass spacer. The increased "process window" afforded by the glass spacer layer advantageously facilitates transfer of the heated substrates/workpieces from the pre-heating station to the stamping/imprinting tool with an additional (i.e., safety) margin before unusable substrate/workpiece temperatures below the $T_{min.}$ (illustratively 140° C.) are reached.

Figure 5:
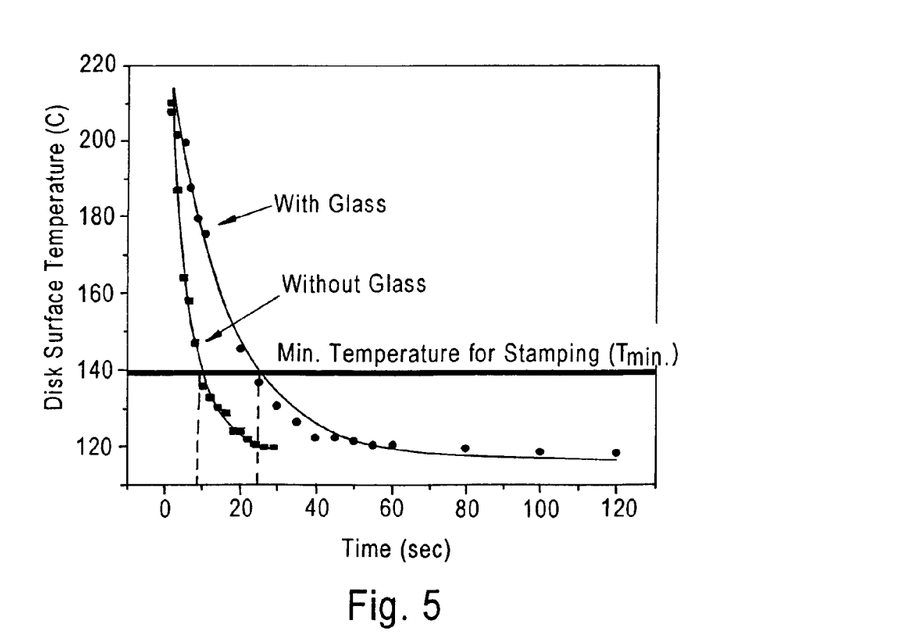
FIG. 5 is a graph for illustrating the effect of the presence of a thermally insulating glass spacer layer beneath the substrate on the process windows for the heated substrate transfer step of the present invention.
Figure 6:
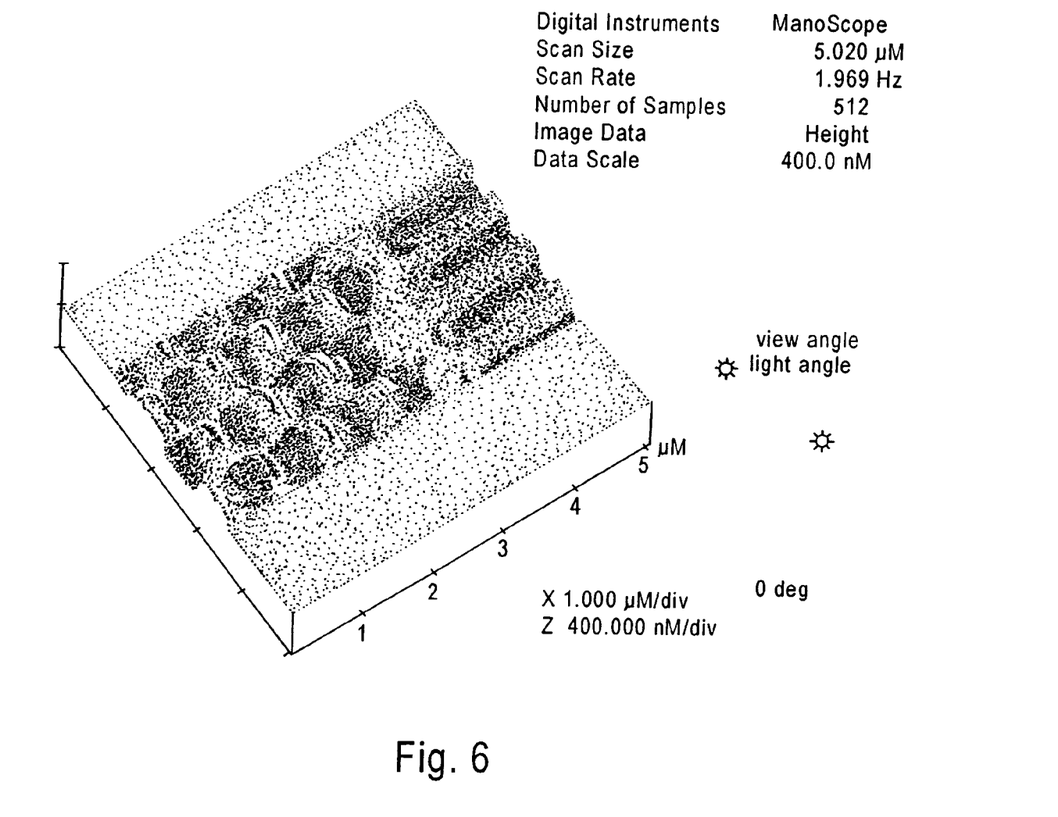
FIG. 6 is an AFM image of a stamped substrate formed according to the process sequence of FIG. 5 utilizing a glass spacer layer.

FIG. 6 is an AFM image of a servo pattern-stamped substrate formed according to the process sequence of FIG. 5 utilizing a glass spacer layer. As should be evident, the thermal imprint lithography process according to the inventive methodology is capable of providing servo pattern formats of excellent quality and replication fidelity.

Thus, the inventive methodology provides for the performance of imprint lithography with improved replication fidelity and substantially reduced cycle times, i.e., from about 5 to about 100 sec., compared with cycle times of about 15–25 min. according to conventional thermal imprint lithographic processing at elevated temperatures. Further, the inventive methodology readily permits the use of stampers/imprinters and substrates/workpieces of different materials, stampers/imprinters with Ni imprinting surfaces can be readily employed for imprinting of glass and metal-based substrates/workpieces, e.g., Al-based substrates, such as are conventionally utilized in the fabrication of hard disk magnetic recording media.

Moreover, the inventive methodology is not limited to use as described above in the illustrative examples; rather, the invention can be practiced with a wide variety of substrates/workpieces, such as, for example, semiconductor substrates utilized in integrated circuit (IC) device manufacture, and the imprinted patterns capable of being formed by the invention are not limited to servo patterns for magnetic recording media, and may, for example, include metallization patterns of semiconductor IC devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of forming a desired pattern in a surface of a substrate for a hard disk recording medium, comprising the steps of:
   (a) providing a substrate in the form of a flat disk having first, upper and second, lower surfaces, said first, upper surface being coated with a layer of a thermoplastic material, said substrate having a thermally insulating spacer in contact with said second, lower surface thereof;
   (b) providing a stamping/imprinting tool including a stamper/imprinter having an imprinting surface comprising a negative image of said pattern to be formed in said surface of said substrate, wherein said stamping/ imprinting tool includes first, upper and second, lower mount for respectively mounting thereon said stamper/imprinter and said substrate, said first and said second mount including a heater for maintaining the respective mount at a pre-selected first high temperature;

(c) maintaining said stamper/imprinter of said stamping/imprinting tool at said pre-selected first high temperature less than a glass transition temperature $T_g$ of said layer of thermoplastic material on said first, upper surface of said substrate;

(d) heating said substrate to a pre-selected second high temperature which is greater than said pre-selected first high temperature of said stamper/imprinter and greater than said glass transition temperature $T_g$ of said layer of thermoplastic material on said first, upper surface of said substrate;

(e) transferring the heated substrate with said thermally insulating spacer to said stamping/imprinting tool and placing said second, upper surface of said heated substrate in overlying relation to said second, lower mount;

(f) urging said heated substrate against said imprinting surface of the heated stamper/imprinter at a pre-selected high pressure sufficient to imprint said pattern in said layer of thermoplastic material on said first, upper surface of said substrate, wherein the temperature of said substrate when said urging of said heated substrate against said imprinting surface of the heated stamper/imprinter commences is above said glass transition temperature $T_g$ of said layer of thermoplastic material on said first, upper surface of said substrate;

(g) continuing said urging of said heated substrate against said imprinting surface of said heated stamper/imprinter at said pre-selected high pressure for a pre-selected interval, during which interval the temperature of said heated substrate is lowered to said pre-selected first high temperature of said stamper/imprinter;

(h) separating said substrate with said imprinted layer of thermoplastic material thereon from said imprinting surface of said stamper/imprinter; and (i) removing said substrate from said stamping/imprinting tool.

2. The method according to claim 1, wherein:
the rate of temperature reduction of said heated substrate from the pre-selected second, higher temperature established in step (d) is lowered relative to the rate of temperature reduction obtained in the absence of said thermally insulating spacer.

3. The method according to claim 1, wherein:
step (a) comprises providing a substrate comprising Al, an Al-based alloy, NiP-coated Al, glass, ceramic, or a glass-ceramic composite material, said substrate comprising a first, upper surface coated with a layer of a polymethyl methacrylate (PMMA) thermoplastic material having a glass transition temperature of about 105° C.;

step (b) comprises providing a stamping/imprinting tool comprising a stamper/imprinter having an imprinting surface including a negative image of a servo pattern to be formed in said thermoplastic PMMA layer on said first, upper surface of said substrate;

step (c) comprises maintaining said stamper/imprinter at a said pre-selected first high temperature of about 120° C.; and step (d) comprises heating said workpiece to a said pre-selected second high temperature of about 200° C.

4. The method according to claim 3, wherein:
step (b) comprises providing a stamper/imprinter having a Ni imprinting surface, said Ni imprinting surface including thereon a layer of a release agent.

5. The method according to claim 1, further comprising the steps of:

(j) forming said desired pattern in said first, upper surface of said substrate by a process comprising selective removal of substrate material, utilizing said imprinted layer of thermoplastic material as a pattern-defining mask; and (k) selectively removing said imprinted layer of thermoplastic material subsequent to performing step (j).

6. A method of performing thermal imprint lithography of a surface of a substrate for forming a pattern therein, comprising:

(a) providing a substrate in the form of a flat disk having first, upper and second, lower surfaces, said first, upper surface being coated with a layer of a thermoplastic material, said substrate having a thermally insulating spacer in contact with said second, lower surface thereof;

(b) providing a stamping/imprinting tool including a stamper/imprinter having an imprinting surface comprising a negative image of said pattern to be formed in said layer of a thermoplastic material, wherein said stamping/imprinting tool includes a first, upper and second, lower mount for respectively mounting thereon said stamper/imprinter and said substrate, said first and said second mount including a heater for maintaining the respective mount at a pre-selected first high temperature;

(c) heating said substrate to a pre-selected second high temperature greater than said pre-selected first high temperature;

(d) transferring the heated substrate with said thermally insulating spacer to said stamping/imprinting tool;

(e) urging said first, upper surface of said heated substrate against said imprinting surface of the heated stamper/imprinter at a pre-selected high pressure sufficient to imprint said pattern in said layer of a thermoplastic material; and (f) continuing said urging of said first, upper surface of said heated substrate against said imprinting surface of said heated stamper/imprinter at said pre-selected high pressure for a pre-selected interval, during which interval the temperature of said heated substrate is lowered to said pre-selected first high temperature of said stamper/imprinter.

7. The method according to claim 6, further comprising the steps of:

(g) separating said substrate with said imprinted layer of thermoplastic material thereon from said imprinting surface of said stamper/imprinter; and (h) removing said substrate from said stamping/imprinting tool.

8. The method according to claim 6, wherein:
step (a) comprises providing a substrate comprising Al, an Al-based alloy, NiP-coated Al, glass, ceramic, or a glass-ceramic composite material.

9. The method according to claim 6, wherein:
step (b) comprises providing a stamper/imprinter having a Ni imprinting surface.

10. The method according to claim 9, wherein:
step (b) further comprises providing said Ni imprinting surface with a layer of a release agent.

11. The method according to claim 9, wherein:

step (a) comprises providing a stamper/imprinter having an imprinting surface coated with a layer of a fluorinated polyether compound.

12. The method according to claim 6, wherein:

step (b) comprises maintaining said stamper/imprinter at said pre-selected first high temperature less than a glass transition temperature $T_g$ of said layer of thermoplastic material on said first, upper surface of said substrate;

step (c) comprises heating said substrate to said pre-selected second high temperature which is greater than said pre-selected first high temperature of said stamper/imprinter and greater than the glass transition temperature $T_g$ of said layer of thermoplastic material on said first, upper surface of said substrate; and step (e) comprises commencing said urging of said heated substrate against said imprinting surface of the heated stamper/imprinter when the temperature of said heated substrate is above said glass transition temperature $T_g$ of said layer of thermoplastic material on said first, upper surface of said substrate.

13. The method according to claim 12, wherein:

step (a) comprises providing a substrate including a first, upper surface coated with a layer of a polymethyl methacrylate (PMMA) thermoplastic material having a glass transition temperature of about 105° C.;

step (b) comprises maintaining said stamper/imprinter at a said pre-selected first high temperature of about 120° C.; and step (c) comprises heating said substrate to a said pre-selected second high temperature of about 200° C.

14. The method according to claim 7, wherein:

step (d) comprises placing said second, upper surface of said heated substrate in overlying relation to said second, lower mounting means mount.

15. The method according to claim 6, wherein:

the rate of temperature reduction of said heated substrate from the pre-selected second, higher temperature established in step (f) is lowered relative to the rate of temperature reduction obtained in the absence of said thermally insulating spacer.

16. The method according to claim 15, wherein:

step (a) comprises providing said substrate with a thermally insulating spacer comprised of a glass material.

* * * * *